(12) United States Patent
Tsai et al.

(10) Patent No.: US 8,466,502 B2
(45) Date of Patent: Jun. 18, 2013

(54) METAL-GATE CMOS DEVICE

(75) Inventors: Shih-Hung Tsai, Tainan (TW); Wen-Tai Chiang, Tainan (TW); Chen-Hua Tsai, Hsinchu County (TW); Cheng-Tzung Tsai, Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 4 days.

(21) Appl. No.: 13/070,483

(22) Filed: Mar. 24, 2011

(65) Prior Publication Data

US 2012/0241868 A1    Sep. 27, 2012

(51) Int. Cl.
*H01L 29/80*    (2006.01)
*H01L 21/00*    (2006.01)

(52) U.S. Cl.
USPC .......................................... 257/274; 438/152

(58) Field of Classification Search
USPC ................. 257/204, 274, 351, 371, E27.067, 257/E27.108; 438/152, 188
See application file for complete search history.

(56) References Cited

U.S. PATENT DOCUMENTS

| | | | |
|---|---|---|---|
| 4,891,303 A | 1/1990 | Garza | |
| 5,217,910 A | 6/1993 | Shimizu | |
| 5,273,930 A | 12/1993 | Steele | |
| 5,356,830 A | 10/1994 | Yoshikawa | |
| 5,372,957 A | 12/1994 | Liang | |
| 5,385,630 A | 1/1995 | Philipossian | |
| 5,399,506 A | 3/1995 | Tsukamoto | |
| 5,625,217 A | 4/1997 | Chau | |
| 5,777,364 A | 7/1998 | Crabbe | |
| 5,783,478 A | 7/1998 | Chau | |
| 5,783,479 A | 7/1998 | Lin | |
| 5,960,322 A | 9/1999 | Xiang | |
| 6,030,874 A | 2/2000 | Grider | |
| 6,048,756 A | 4/2000 | Lee | |
| 6,074,954 A | 6/2000 | Lill | |
| 6,100,171 A | 8/2000 | Ishida | |
| 6,110,787 A | 8/2000 | Chan | |
| 6,165,826 A | 12/2000 | Chau | |
| 6,165,881 A | 12/2000 | Tao | |
| 6,191,052 B1 | 2/2001 | Wang | |
| 6,228,730 B1 | 5/2001 | Chen | |
| 6,274,447 B1 | 8/2001 | Takasou | |
| 6,355,533 B2 | 3/2002 | Lee | |
| 6,365,476 B1 | 4/2002 | Talwar | |
| 6,368,926 B1 | 4/2002 | Wu | |
| 6,444,591 B1 | 9/2002 | Schuegraf | |
| 6,537,370 B1 | 3/2003 | Hernandez | |
| 6,544,822 B2 | 4/2003 | Kim | |
| 6,605,498 B1 | 8/2003 | Murthy | |

(Continued)

*Primary Examiner* — Calvin Lee
(74) *Attorney, Agent, or Firm* — Winston Hsu; Scott Margo (57) ABSTRACT

A method for fabricating a metal-gate CMOS device. A substrate having thereon a first region and a second region is provided. A first dummy gate structure and a second dummy gate structure are formed within the first region and the second region respectively. A first LDD is formed on either side of the first dummy gate structure and a second LDD is formed on either side of the second dummy gate structure. A first spacer is formed on a sidewall of the first dummy gate structure and a second spacer is formed on a sidewall of the second dummy gate structure. A first embedded epitaxial layer is then formed in the substrate adjacent to the first dummy gate structure. The first region is masked with a seal layer. Thereafter, a second embedded epitaxial layer is formed in the substrate adjacent to the second dummy gate structure.

8 Claims, 8 Drawing Sheets

U.S. PATENT DOCUMENTS

| | | |
|---|---|---|
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,855,607 B2 | 2/2005 | Achuthan |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,013,446 B2 | 3/2006 | Ohba |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,176,116 B2 | 2/2007 | Cabral, Jr. |
| 7,183,596 B2 | 2/2007 | Wu |
| 7,202,124 B2 | 4/2007 | Fitzgerald |
| 7,217,627 B2 | 5/2007 | Kim |
| 7,250,658 B2 | 7/2007 | Doris |
| 7,288,822 B1 | 10/2007 | Ting |
| 7,303,999 B1 | 12/2007 | Sriraman |
| 7,335,959 B2 | 2/2008 | Curello |
| 7,410,859 B1 | 8/2008 | Peidous |
| 7,462,239 B2 | 12/2008 | Brabant |
| 7,491,615 B2 | 2/2009 | Wu |
| 7,494,856 B2 | 2/2009 | Zhang |
| 7,494,858 B2 | 2/2009 | Bohr |
| 7,521,324 B2 | 4/2009 | Ohmi |
| 7,531,437 B2 | 5/2009 | Brask |
| 7,592,231 B2 | 9/2009 | Cheng |
| 7,592,270 B2 | 9/2009 | Teo |
| 7,667,227 B2 | 2/2010 | Shimamune |
| 7,691,752 B2 | 4/2010 | Ranade |
| 7,838,370 B2 | 11/2010 | Mehta |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0292779 A1 | 12/2006 | Chen |
| 2006/0292783 A1 | 12/2006 | Lee |
| 2007/0015365 A1 | 1/2007 | Chen |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0128783 A1 | 6/2007 | Ting |
| 2007/0166929 A1 | 7/2007 | Matsumoto |
| 2007/0218661 A1 | 9/2007 | Shroff |
| 2007/0262396 A1 | 11/2007 | Zhu |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0220579 A1 | 9/2008 | Pal |
| 2008/0233722 A1 | 9/2008 | Liao |
| 2008/0233746 A1 | 9/2008 | Huang |
| 2009/0039389 A1 | 2/2009 | Tseng |
| 2009/0045456 A1 | 2/2009 | Chen |
| 2009/0057759 A1 | 3/2009 | Obradovic |
| 2009/0095992 A1 | 4/2009 | Sanuki |
| 2009/0117715 A1 | 5/2009 | Fukuda |
| 2009/0124056 A1 | 5/2009 | Chen |
| 2009/0124097 A1 | 5/2009 | Cheng |
| 2009/0166625 A1 | 7/2009 | Ting |
| 2009/0184402 A1 | 7/2009 | Chen |
| 2009/0186475 A1 | 7/2009 | Ting |
| 2009/0200494 A1 | 8/2009 | Hatem |
| 2009/0246922 A1 | 10/2009 | Wu |
| 2009/0278170 A1 | 11/2009 | Yang |
| 2009/0280614 A1 * | 11/2009 | Chen et al. ............ 438/305 |
| 2009/0302348 A1 | 12/2009 | Adam |
| 2010/0001317 A1 | 1/2010 | Chen |
| 2010/0044783 A1 | 2/2010 | Chuang |
| 2010/0048027 A1 | 2/2010 | Cheng |
| 2010/0093147 A1 | 4/2010 | Liao |
| 2010/0129994 A1 | 5/2010 | Awad |
| 2012/0104498 A1 * | 5/2012 | Majumdar et al. ............ 257/351 |

* cited by examiner

METAL-GATE CMOS DEVICE

BACKGROUND OF THE INVENTION

1. Field of the Invention

The present invention relates generally to semiconductor device and fabrication method thereof. More particularly, the present invention relates to a dual work-function metal-gate CMOS device and fabrication method thereof.

2. Description of the Prior Art

The continued scaling of CMOS devices into sub-40 nm technology will rely on a fundamental change in transistor gate stack materials. Over the past few years, research in this area has focused on identifying candidate materials to replace polysilicon and $SiO_2$ as the gate electrode and gate dielectric, respectively. Critical requirements for novel gate electrode materials include thermal stability with the gate dielectric and suitable values for the interfacial work function. The latter requirement of obtaining complementary gate work functions on a single wafer is being perceived as a major process integration challenge.

Metal-gate electrodes bring about several advantages compared to traditional polysilicon gates as CMOS technology continues to scale beyond the 40 nm node. These include reduction in poly-depletion effect, reduction in sheet resistance, and potentially better thermal stability on high-K gate dielectrics. The main challenge is that, unlike with polysilicon, one would have to use two metallic materials (bi-layer metal) with different work functions in order to achieve the right threshold voltages for both NMOS and PMOS.

The conventional dual metal gate methods are categorized into the gate-first process and the gate-last process. Among the two main approaches, the gate-last process is able to avoid processes of high thermal budget and to provide wider material choices for the high-K gate dielectric layer and the metal gate, and thus gradually replaces the gate-first process. In a conventional gate-last process, a dummy gate (or "replacement gate") is formed on a substrate and followed by steps of forming a conventional MOS transistor and forming an interlayer dielectric (ILD) layer. Subsequently, the dummy gate is removed to form a gate trench. Thereafter, the gate trench is filled with metal layers required for different conductivity types.

It is well known in the art that the degree of difficulty for fabricating a well-controlled double work function metal is immense as the process often involves complicated integration between NMOS device and PMOS device. The difficulty increases even more as the thickness and materials used in double work function metal gates requires a much more strict demand. Hence, how to successfully integrate the fabrication of a conventional double work function metal gate transistor so as to reduce its complexity to the standard CMOS process flow has become an important study in the field.

SUMMARY OF THE INVENTION

It is one objective of the invention to provide an improved method for fabricating a dual work-function metal-gate CMOS device, which integrates embedded SiGe/SiC epitaxial processes and is capable of simplifying the CMOS fabrication steps and complexity, thereby reducing manufacture cost.

According to one aspect of the invention, a method for fabricating a metal-gate CMOS device is provided. A substrate having thereon a first region and a second region is provided. A first dummy gate structure and a second dummy gate structure are formed within the first region and the second region respectively. A first lightly doped drain (LDD) is formed on either side of the first dummy gate structure and a second LDD is formed on either side of the second dummy gate structure. A first spacer is formed on a sidewall of the first dummy gate structure and a second spacer is formed on a sidewall of the second dummy gate structure. A first embedded epitaxial layer is then formed in the substrate adjacent to the first dummy gate structure. The first region is masked with a seal layer. Thereafter, a second embedded epitaxial layer is formed in the substrate adjacent to the second dummy gate structure.

After forming the second embedded epitaxial layer, a first contact hole etch stop layer (CESL) on the substrate is deposited in a blanket manner to cover the first and second regions. A first dielectric layer is then formed on the first CESL. A chemical mechanical polishing (CMP) process is performed to remove a portion of the first dielectric layer and a portion of the first CESL to expose the first and second dummy gate structures. The first and second dummy gate structures is then removed to thereby form a first gate trench and a second gate trench. A first gate dielectric layer and a first metal gate are formed in the first gate trench. A second dielectric layer and a second metal gate are formed in the second gate trench.

After forming the first and second metal gates, a second dielectric layer is formed on the substrate. The first and second dielectric layers, the first CESL and the seal layer in the first region are etched to form a first contact hole, and the first and second dielectric layers and the first CESL in the second region are etched to form a second contact hole. A silicide layer is then formed at a bottom of each of the first and second contact holes. The first and second contact holes are filled with a metal layer to thereby form a first contact plug and a second contact plug.

According to another embodiment of the invention, after forming the second embedded epitaxial layer, the first dielectric layer, the first CESL and the seal layer are removed. A stressed second CESL is deposited. A third dielectric layer is then deposited on the stressed second CESL. The third dielectric layer and the stressed second CESL in the first region are etched to form a first contact hole, and the third dielectric layer and the stressed second CESL in the second region are etched to form a second contact hole. A silicide layer is formed at a bottom of each of the first and second contact holes. The first and second contact holes are filled with a metal layer to thereby form a first contact plug and a second contact plug.

In one aspect, the present invention provides a metal-gate CMOS device including a substrate having a PMOS region and an NMOS region; a PMOS transistor in the PMOS region of the substrate; an NMOS transistor in the NMOS region of the substrate; a seal layer only masking the PMOS transistor within the PMOS region; and a contact hole etch stop layer (CESL) covering the seal layer within the PMOS region and covering the NMOS transistor within the NMOS region. The PMOS transistor comprises a first metal gate and a first gate dielectric layer. The first gate dielectric layer comprises metal oxide including hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide ($LaAlO_3$), tantalum oxide ($Ta_2O_5$), zirconium oxide ($ZrO_2$), zirconium silicon oxide ($ZrSiO_4$), or hafnium zirconium oxide ($HfZrO_2$). The PMOS transistor further comprises an embedded SiGe epitaxial layer in a source/drain region of the PMOS transistor and an embedded SiC epitaxial layer in a source/drain region of the NMOS transistor.

These and other objectives of the present invention will no doubt become obvious to those of ordinary skill in the art after

DETAILED DESCRIPTION

Figure 1:
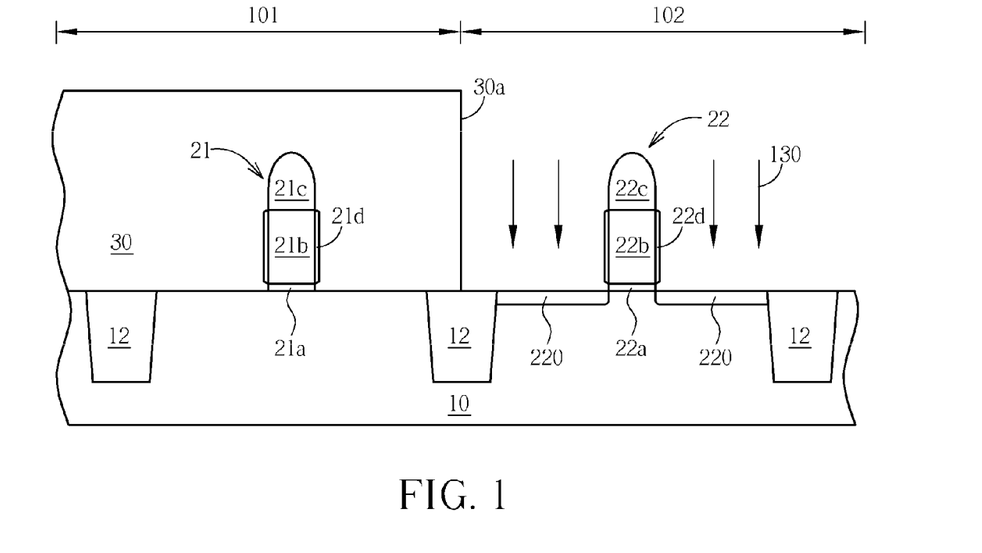
FIG. 1 to FIG. 14 are schematic, cross-sectional diagrams showing a method for fabricating a dual work-function CMOS device in accordance with one preferred embodiment of this invention.

Please refer to FIG. 1 to FIG. 14. FIG. 1 to FIG. 14 are schematic, cross-sectional diagrams showing a method for fabricating a dual work-function CMOS device in accordance with one preferred embodiment of this invention. As shown in FIG. 1, a substrate 10 such as silicon substrate, silicon-containing substrate, silicon-on-insulator (SOI) substrate or epitaxial substrate is provided. A plurality of shallow trench isolation (STI) structures 12 are provided in the main surface of the substrate 10 to electrically isolate at least one PMOS region 101 and at least one NMOS region 102. Subsequently, a dummy gate structure 21 and a dummy gate structure 22 are formed on the substrate 10 within the PMOS region 101 and the NMOS region 102 respectively. The dummy gate structure 21 may comprise a gate oxide layer 21a, a polysilicon layer 21b, a cap layer 21c and a sidewall oxide layer 21d. The dummy gate structure 22 may comprise a gate oxide layer 22a, a polysilicon layer 22b, a cap layer 22c and a sidewall oxide layer 22d. The cap layer 21c or the cap layer 22c may comprise silicon nitride. After the formation of the dummy gate structures 21 and 22, a patterned photoresist layer 30 is used to mask the PMOS region 101. The NMOS region 102 is exposed by the opening 30a in the patterned photoresist layer 30. An LDD ion implantation 130 is carried out to form LDD regions 220 in the substrate 10 next to the dummy gate structure 22 within the NMOS region 102.

Figure 2:
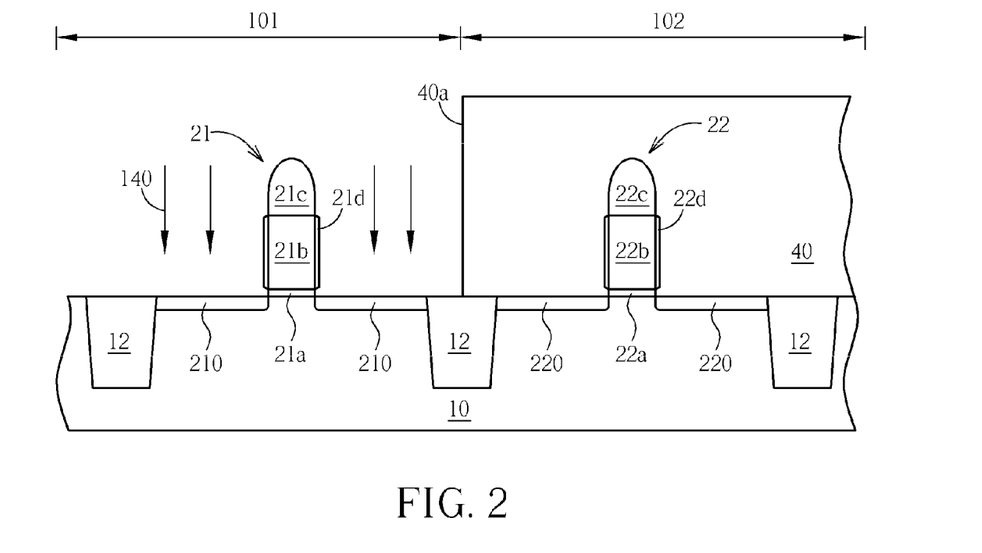

As shown in FIG. 2, after the LDD ion implantation 130, the patterned photoresist layer 30 is stripped off. Another patterned photoresist layer 40 is used to mask the NMOS region 102. The PMOS region 101 is exposed by the opening 40a in the patterned photoresist layer 40. An LDD ion implantation 140 is then carried out to form LDD regions 210 in the substrate 10 next to the dummy gate structure 21 within the PMOS region 101. Thereafter, the patterned photoresist layer 40 is stripped off. Of course, it is to be understood that the LDD step in FIG. 1 and the LDD step in FIG. 2 are interchangeable. For example, the LDD regions 210 in the PMOS region 101 may be formed prior to the formation of the LDD regions 220 in the NMOS region 102.

Figure 3:
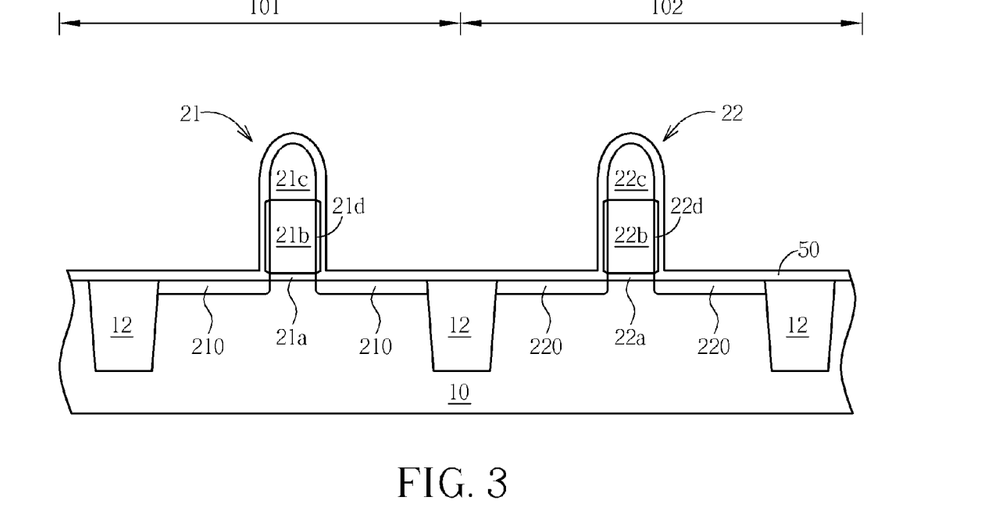
Figure 4:
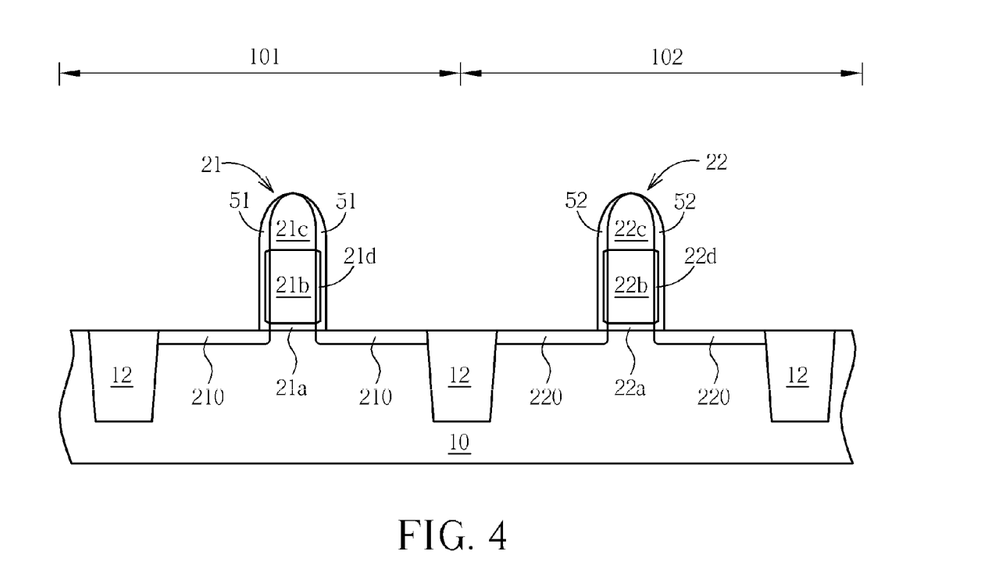

As shown in FIG. 3, a spacer material layer 50 is deposited over the substrate 10 in a blanket manner. The spacer material layer 50 covers the PMOS region 101 and the NMOS region 102. According to the preferred embodiment of the invention, the spacer material layer 50 is carbon-doped silicon nitride layer with its dielectric constant that is higher than the dielectric constant of the undoped silicon nitride. As shown in FIG. 4, subsequently, an anisotropic dry etching process is performed to etch the spacer material layer to thereby form a pair of spacers 51 on the sidewalls of the dummy gate structure 21 and a pair of spacers 52 on the sidewalls of the dummy gate structure 22. It is noteworthy that one technical feature of this invention is that the gate sidewall spacers are formed after the LDD implant.

Figure 5:
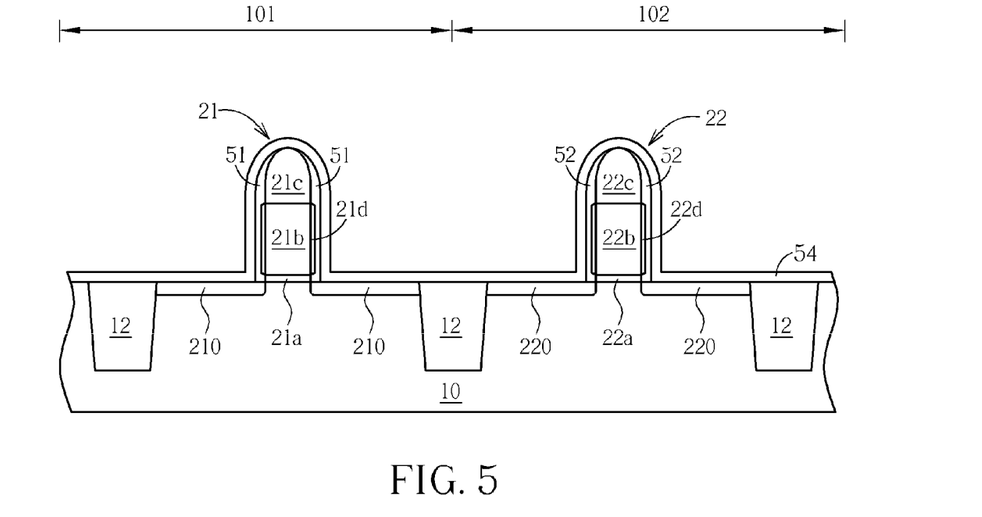

Subsequently, as shown in FIG. 5, a sacrificial silicon nitride layer 54 is deposited over the substrate 10 in a blanket manner. The sacrificial silicon nitride layer 54 covers the PMOS region 101 and the NMOS region 102. According to the preferred embodiment of this invention, the sacrificial silicon nitride layer 54 may be undoped silicon nitride layer as long as significant etching selectivity is present between the spacer material layer 50 and the sacrificial silicon nitride layer 54. More specifically, the etching rate of the sacrificial silicon nitride layer 54 is much higher than the etching rate of the spacer material layer 50.

Figure 6:
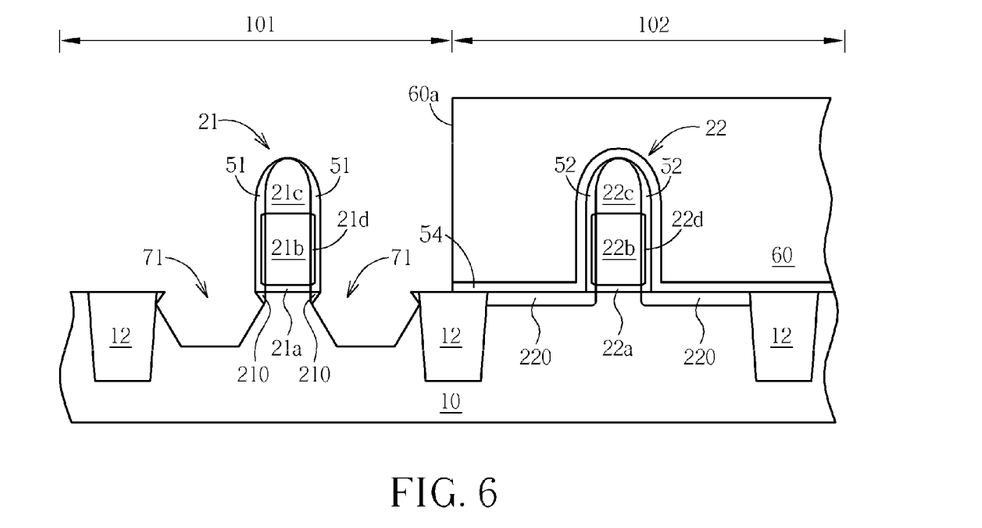
Figure 7:
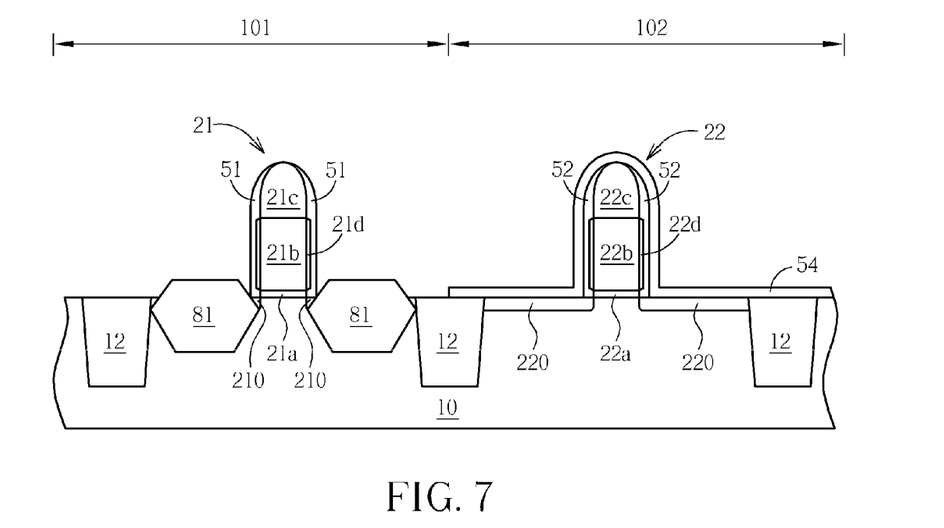

As shown in FIG. 6, a patterned photoresist layer 60 is used to mask the NMOS region 102. The PMOS region 101 is exposed by the opening 60a in the patterned photoresist layer 60. Subsequently, a self-aligned etching process is performed to form a sigma-shaped recess 71 in the substrate 10 on each side of the dummy gate structure 21 within the PMOS region 101. After the formation of the sigma-shaped recess 71, the patterned photoresist layer 60 is stripped off. As shown in FIG. 7, a SiGe epitaxial process is carried out in the PMOS region 101 to grow SiGe epitaxial layer 81 in the sigma-shaped recess 71. According to the preferred embodiment of this invention, the SiGe epitaxial layer 81 is in-situ doped with P type dopants to thereby form a $P^+$ embedded SiGe epitaxial layer 81. By doing so, the subsequent source/drain (S/D) ion implantation step for the PMOS and the corresponding $P^+$ S/D photo mask can be spared.

Figure 8:
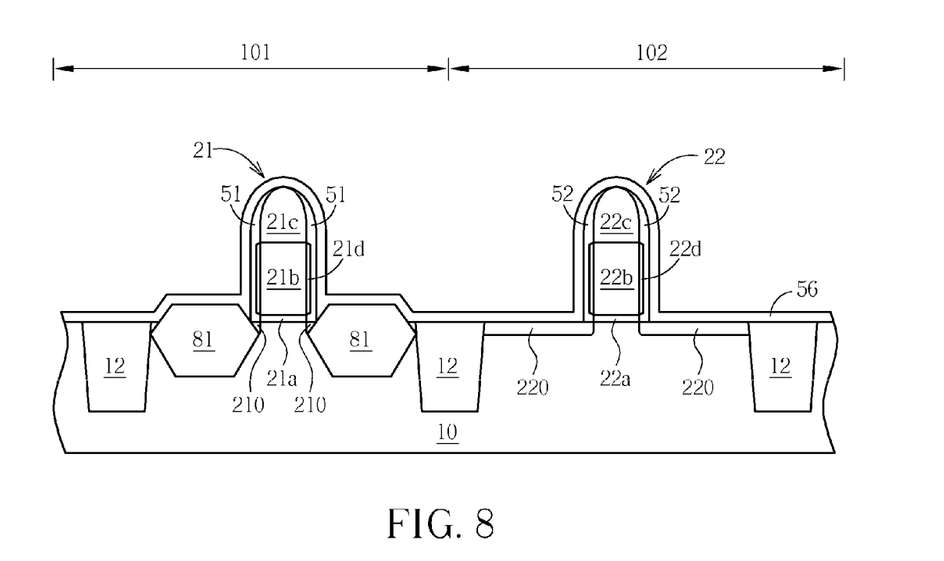

As shown in FIG. 8, an etching process is performed to selectively remove the remaining sacrificial silicon nitride layer 54 from the NMOS region 102. In other embodiments, however, this etching process may be omitted. Subsequently, a deposition process is performed, for example, a chemical vapor deposition (CVD) process or an atomic layer deposition (ALD) process, to deposit a silicon nitride seal layer 56 over the substrate 10 in a blanket manner. The silicon nitride seal layer 56 may have a thickness of about 50-200 angstroms.

Figure 9:
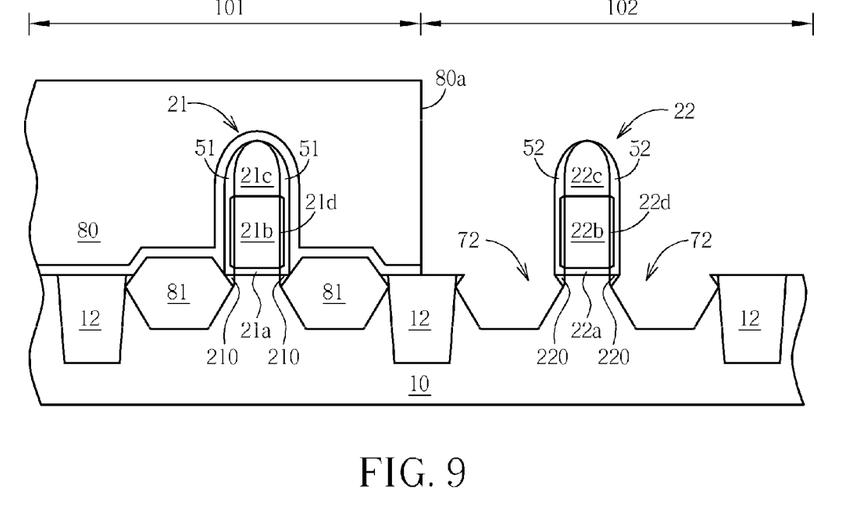
Figure 10:
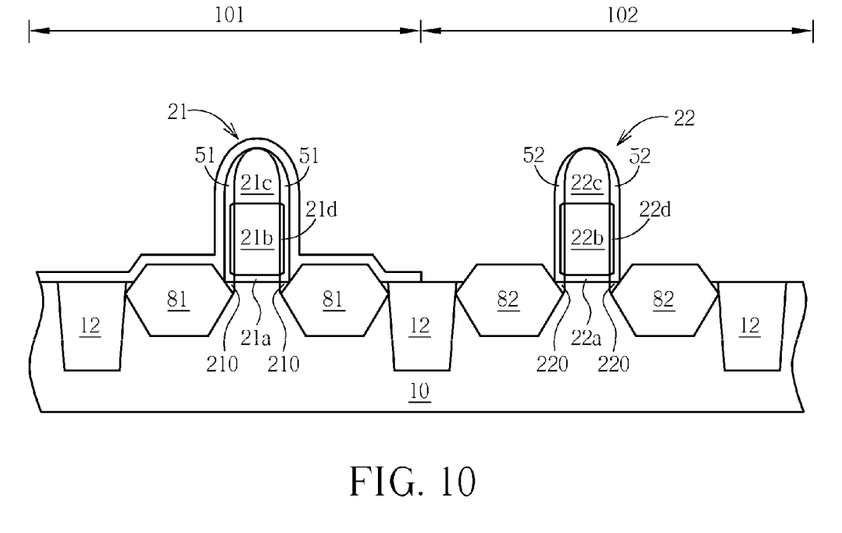

As shown in FIG. 9, a patterned photoresist layer 80 is used to mask the PMOS region 101. The NMOS region 102 is exposed by the opening 80a in the patterned photoresist layer 80. Subsequently, an etching process is performed to form a sigma-shaped recess 72 in the substrate 10 on each side of the dummy gate structure 22 within the NMOS region 102. After the formation of the sigma-shaped recess 72, the patterned photoresist layer 80 is stripped off. As shown in FIG. 10, a SiC epitaxial process is carried out in the NMOS region 102 to grow SiC epitaxial layer 82 in the sigma-shaped recess 72. According to the preferred embodiment of this invention, the SiC epitaxial layer 82 is in-situ doped with N type dopants to thereby form an $N^+$ embedded SiC epitaxial layer 82. By doing so, the subsequent source/drain (S/D) ion implantation step for the NMOS and the corresponding $N^+$ S/D photo mask can be spared. It is understood that the embedded SiGe epitaxial steps for PMOS region in FIGS. 6-7 and the embedded SiC epitaxial for NMOS region in FIGS. 9-10 are interchangeable. For example, the embedded SiC epitaxial for NMOS region may be carried out prior to the embedded SiGe epitaxial steps for PMOS region in other cases.

Figure 11:
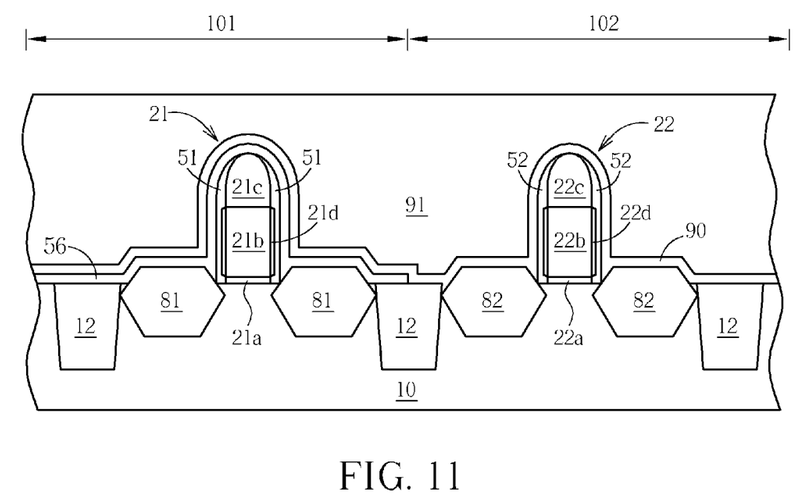

As shown in FIG. 11, a contact hole etch stop layer (CESL) 90 such as a silicon nitride layer is deposited over the substrate 10 in a blanket manner. The CESL 90 may have a thickness of about 100-150 angstroms. According to the preferred embodiment of this invention, the CESL 90 does not contain stress. Subsequently, a dielectric layer 91 such as silicon oxide or low-k material is deposited onto the CESL 90.

Figure 12:
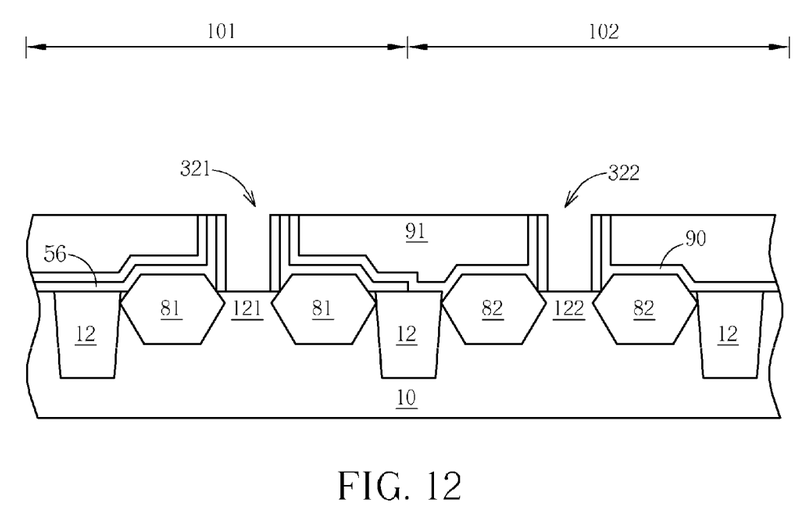

As shown in FIG. 12, an upper portion of the dielectric layer 91, a portion of the CESL 90, the cap layer 21c of the dummy gate structure 21 and the cap layer 22c of the dummy gate structure 22 are removed by CMP (chemical mechanical polishing), thereby exposing the polysilicon layer 21b of the dummy gate structure 21 and the polysilicon layer 22b of the dummy gate structure 22. Subsequently, the remaining dummy gate structure 21 including the polysilicon layer 21b and the gate oxide layer 21a and the remaining dummy gate structure 22 including the polysilicon layer 22b and the gate oxide layer 22a are completely removed by etching methods, thereby forming gate trench 321 and gate trench 322, which expose the PMOS channel region 121 and the NMOS channel region 122 respectively.

Figure 13:
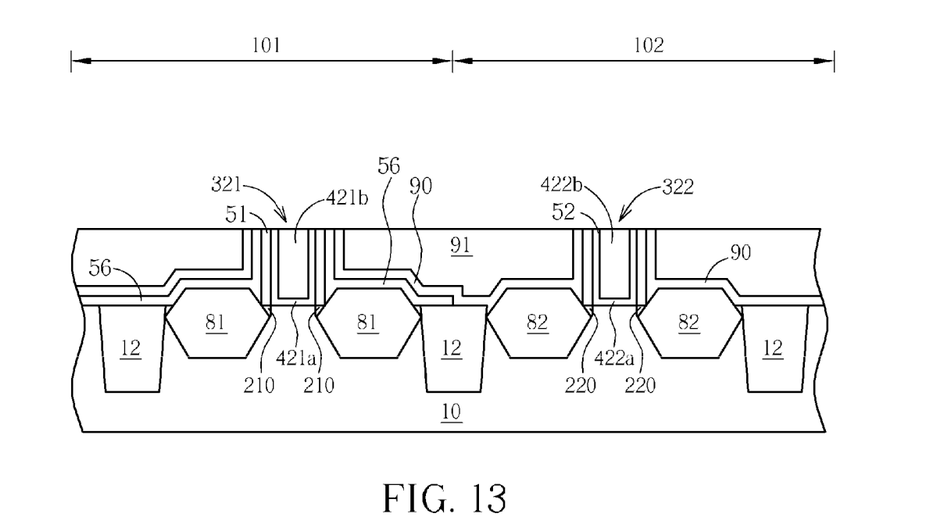

As shown in FIG. 13, a high-k gate dielectric layer 421a and a metal gate 421b are formed inside the gate trench 321, and a high-k gate dielectric layer 422a and a metal gate 422b are formed inside the gate trench 322. According to the preferred embodiment of this invention, the high-k gate dielectric layers 421a and 422a may include but not limited to silicon nitride, silicon oxynitride or metal oxide. For example, the aforesaid metal oxide may include but not limited to hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide ($LaAlO_3$), tantalum oxide ($Ta_2O_5$), zirconium oxide ($ZrO_2$), zirconium silicon oxide ($ZrSiO_4$), or hafnium zirconium oxide ($HfZrO_2$). The metal gates 422a and 422b may include but not limited to titanium nitride, aluminum nitride, tantalum nitride, aluminum or work-function metals. The metal gates 421b and 422b may be single-layered or composite layer. The high-k gate dielectric layers 421a and 422a may be formed by CVD methods or ALD methods, for example. The metal gates 421b and 422b may be formed by CVD methods, PVD methods or sputtering methods. The excess metal layers outside the gate trenches 321 and 322 may be removed by CMP.

Figure 14:
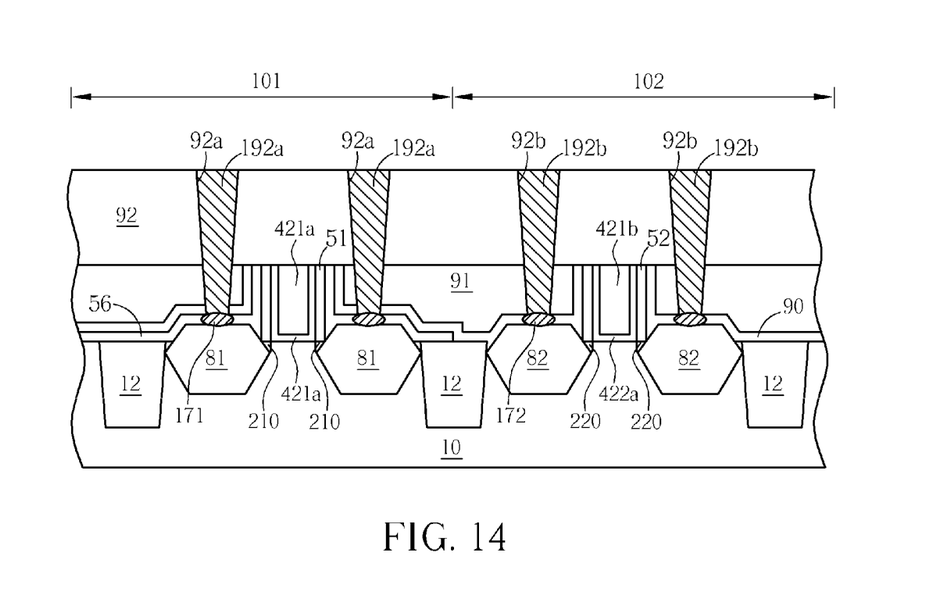

As shown in FIG. 14, after the high-k/metal gate (HK/MG) processes, a dielectric layer 92 may be deposited over the substrate in a blanket manner. Subsequently, a contact hole/contact plug forming process is carried out. A dry etching process is performed to etch the dielectric layers 92 and 91, the CESL 90 and the silicon nitride seal layer 56 within the PMOS region 101 to form the contact holes 92a exposing source/drain regions of the PMOS transistor, and etch the dielectric layers 92 and 91, and the CESL 90 within the NMOS region 102 to form the contact holes 92b exposing the source/drain regions of the NMOS transistor. Thereafter, a self-aligned silicidation process is performed to form salicide layers 171 and 172 such as nickel silicide (NiSi) or NiPt at the bottom of the contact hole 92a and the bottom of the contact hole 92b respectively. Thereafter, metal adhesion layer such as titanium, titanium nitride or tungsten is deposited to fill the contact holes 92a and 92b thereby forming contact plugs 192a and 192b. As can be seen in FIG. 14, one of the technical features of the invention is that the PMOS region 101 is covered by silicon nitride seal layer 56 and the CESL 90 while the NMOS region 102 is covered by CESL 90.

Figure 15:
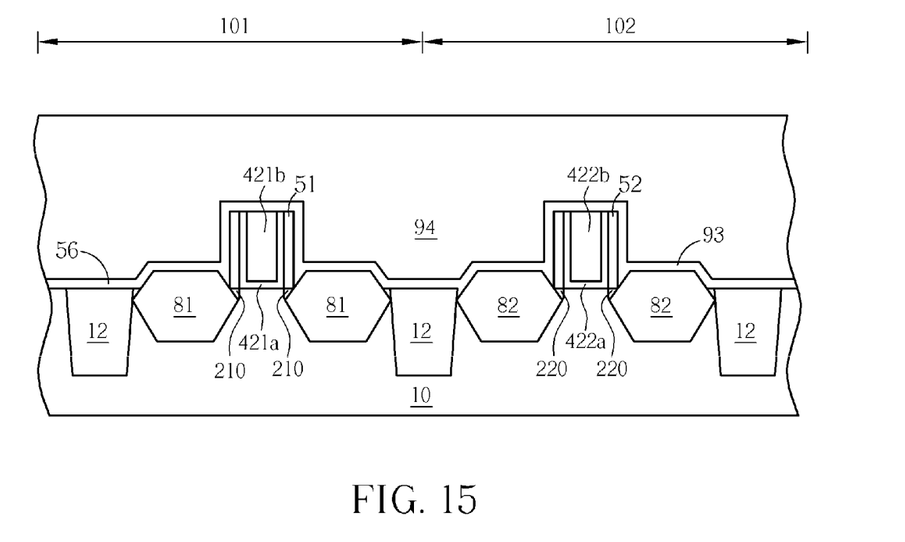
FIG. 15 to FIG. 16 are schematic, cross-sectional diagrams showing a method for fabricating a dual work-function CMOS device in accordance with another preferred embodiment of this invention.
Figure 16:
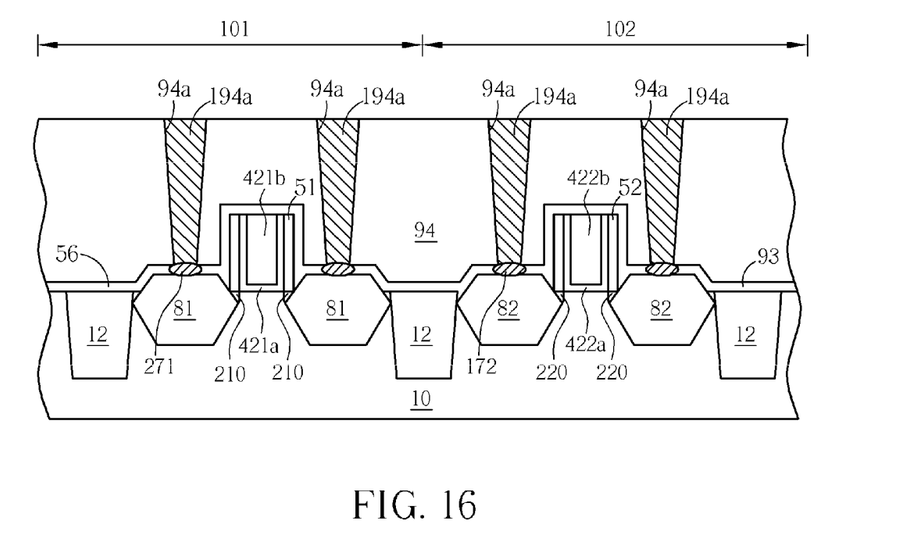

FIG. 15 to FIG. 16 demonstrate an alternative method for fabricating the dual work-function metal-gate CMOS device in accordance with another embodiment of this invention, wherein FIG. 15 follows the step as shown in FIG. 13. As shown in FIG. 15, after the HK/MG process as set forth in FIG. 13, the remaining dielectric layer 91, the CESL 90 and the silicon nitride seal layer 56 are removed. Another CESL 93 and another dielectric layer 94 are deposited onto the substrate 10. According to the preferred embodiment of this invention, the CESL 93 is a stressed CESL, for example, tensile-stressed or compressive-stressed. The stressed CESL 93 is used to improve the device performance.

Subsequently, as shown in FIG. 16, a contact hole/contact plug forming process is carried out. A dry etching process is performed to etch the dielectric layers 94 and the CESL 93 within the PMOS region 101 to form the contact holes 94a exposing source/drain regions of the PMOS transistor, and etch the dielectric layers 94 and the CESL 93 within the NMOS region 102 to form the contact holes 94b exposing the source/drain regions of the NMOS transistor. A self-aligned silicidation process is then performed to form salicide layers 271 and 272 such as nickel silicide at the bottom of the contact hole 94a and the bottom of the contact hole 94b respectively. Thereafter, metal adhesion layer such as titanium, titanium nitride or tungsten is deposited to fill the contact holes 94a and 94b thereby forming contact plugs 194a and 194b.

Those skilled in the art will readily observe that numerous modifications and alterations of the device and method may be made while retaining the teachings of the invention.

What is claimed is:

1. A metal-gate CMOS device, comprising:
   a substrate having a first-conductivity-type MOS region and a second-conductivity-type MOS region;
   a first-conductivity-type MOS transistor in the first-conductivity-type MOS region of the substrate;
   a second-conductivity-type MOS transistor in the second-conductivity-type MOS region of the substrate;
   a seal layer only masking the first-conductivity-type MOS transistor within the first-conductivity-type MOS region; and
   a contact hole etch stop layer (CESL) covering the seal layer within the first-conductivity-type MOS region and covering the second-conductivity-type MOS transistor within the second-conductivity-type MOS region, wherein the contact hole etch stop layer does not contain stress.

2. The metal-gate CMOS device according to claim 1 wherein the first-conductivity-type MOS transistor comprises an embedded SiGe epitaxial layer in a source/drain region of the first-conductivity-type MOS transistor.

3. The metal-gate CMOS device according to claim 2 wherein the seal layer directly contacts with the embedded SiGe epitaxial layer.

4. The metal-gate CMOS device according to claim 1 wherein the first-conductivity-type MOS transistor comprises a first metal gate and a first gate dielectric layer, and wherein the first metal gate comprises titanium nitride, aluminum nitride, tantalum nitride, aluminum or work-function metals.

5. The metal-gate CMOS device according to claim 1 wherein the second-conductivity-type MOS transistor comprises an embedded SiC epitaxial layer in a source/drain region of the second-conductivity-type MOS transistor.

6. The metal-gate CMOS device according to claim 1 wherein the second-conductivity-type MOS transistor comprises a second metal gate and a second gate dielectric layer, and wherein the second metal gate comprises titanium nitride, aluminum nitride, tantalum nitride, aluminum or work-function metals.

7. The metal-gate CMOS device according to claim 1 wherein the seal layer is a silicon nitride seal layer.

8. The metal-gate CMOS device according to claim 1 wherein the first-conductivity-type MOS region is a PMOS region and the second-conductivity-type MOS region is a NMOS region.

\* \* \* \* \*